United States Patent
Park et al.

(10) Patent No.: US 10,615,085 B2
(45) Date of Patent: Apr. 7, 2020

(54) METHOD FOR PREDICTING THICKNESS OF OXIDE LAYER OF SILICON WAFER

(71) Applicant: SK SILTRON CO., LTD., Gumi-si, Gyeongsangbuk-do (KR)

(72) Inventors: Jung Kil Park, Gumi-si (KR); Sung Woo Jung, Gumi-si (KR); Ja Young Kim, Gumi-si (KR)

(73) Assignee: SK Siltron Co., Ltd., Gumi-si, Gyeongsangbuk-do (KR)

( * ) Notice: Subject to any disclaimer, the term of this patent is extended or adjusted under 35 U.S.C. 154(b) by 0 days.

(21) Appl. No.: 16/172,947

(22) Filed: Oct. 29, 2018

(65) Prior Publication Data
US 2019/0131191 A1    May 2, 2019

(30) Foreign Application Priority Data
Oct. 31, 2017   (KR) .................. 10-2017-0143090

(51) Int. Cl.
*H01L 21/66* (2006.01)
*H01L 21/67* (2006.01)
*G01B 21/08* (2006.01)

(52) U.S. Cl.
CPC ............. *H01L 22/12* (2013.01); *G01B 21/08* (2013.01); *H01L 21/67103* (2013.01); *H01L 22/20* (2013.01); *G01B 21/085* (2013.01)

(58) Field of Classification Search
CPC . H01L 22/12; H01L 21/67103; G01B 21/085; G01B 21/08
See application file for complete search history.

(56) References Cited

U.S. PATENT DOCUMENTS

| | | | |
|---|---|---|---|
| 6,806,144 B2 * | 10/2004 | Chen | C23C 8/10 427/579 |
| 7,012,684 B1 * | 3/2006 | Hunter | G01N 21/8903 250/559.44 |
| 7,700,376 B2 * | 4/2010 | Chacin | H01L 22/20 257/E21.525 |

(Continued)

FOREIGN PATENT DOCUMENTS

| JP | 2002-286442 | 10/2002 |
|---|---|---|
| JP | 2010-147265 | 7/2010 |

(Continued)

OTHER PUBLICATIONS

Hiroshi Yamada, "Ultradry oxidation system equipped with a newly designed gas preheating unit for growing ultrathin silicon oxide films", Review of Scientific Intsruments, vol. 65 (11) American Institute of Physics, Nov. 1994, pp. 3501-3504.*

(Continued)

*Primary Examiner* — William Coleman
(74) *Attorney, Agent, or Firm* — KED & Associates LLP

(57) ABSTRACT

An embodiment provides a method of predicting a thickness of an oxide layer of a silicon wafer including: aging a heat treatment furnace (furnace); measuring a thickness of each of the oxide layers after disposing a plurality of reference wafers in slots of a heat treatment boat in the furnace and forming oxide layers; and measuring a thickness of each of the oxide layers after disposing the plurality of reference wafers and test wafers in the slots of the heat treatment boat in the furnace and forming oxide layers.

18 Claims, 7 Drawing Sheets

(56) References Cited

U.S. PATENT DOCUMENTS

| | | | | |
|---|---|---|---|---|
| 7,713,758 B2* | 5/2010 | Yamashita | ........ | H01L 21/32137 |
| | | | | 438/706 |
| 7,751,922 B2* | 7/2010 | Hirano | .............. | H01L 21/67265 |
| | | | | 700/112 |
| 7,796,804 B2* | 9/2010 | Bhaskar | ................. | G01N 21/93 |
| | | | | 382/103 |
| 7,851,365 B1* | 12/2010 | Herbots | ............ | H01L 21/02052 |
| | | | | 438/689 |
| 2010/0097607 A1* | 4/2010 | Susaki | ............... | G01B 11/0641 |
| | | | | 356/369 |

FOREIGN PATENT DOCUMENTS

| | | |
|---|---|---|
| KR | 10-0888539 | 3/2009 |
| KR | 10-2011-0014978 | 2/2011 |

OTHER PUBLICATIONS

Korean Office Action dated Jan. 22, 2019 issued in Application No. 10-2017-0143090.

* cited by examiner

METHOD FOR PREDICTING THICKNESS OF OXIDE LAYER OF SILICON WAFER

CROSS-REFERENCE TO RELATED APPLICATIONS

This application claims under 35 U.S.C. § 119 to Korean Patent Application No. 10-2017-0143090, filed in Korea on Oct. 31, 2017, which is hereby incorporated by reference.

TECHNICAL FIELD

Embodiments relate to a method of predicting a thickness of an oxide layer of a silicon wafer, and more particularly, to a method of determining a factor affecting a thickness of an oxide layer in a process of fabricating a silicon wafer.

BACKGROUND

A silicon wafer which is used as a material for a semiconductor element refers to a thin plate of a single crystal silicon made of polycrystalline silicon as a raw material.

A silicon wafer is divided into a polished wafer, an epitaxial wafer, a silicon on insulator (SOI) wafer, a diffused wafer, a hydrogen annealed wafer, and the like according to a processing method.

The epitaxial wafer refers to a wafer in which another single crystal layer (epitaxial layer) is grown on a surface of a conventional silicon wafer, and has fewer surface defects than the conventional silicon wafer, and has properties capable of controlling a concentration or kind of impurities. In addition, the epitaxial layer has high purity and excellent crystallinity, which is advantageous for improving a yield and device properties of a highly integrated semiconductor device.

As a silicon oxide layer becomes thinner, a tolerance range of a thickness of the oxide layer becomes smaller, and it is also becoming increasingly important to uniformly form the oxide layer.

Therefore, in order to accurately predict a growth of an oxide layer of a silicon wafer, it is necessary to accurately predict parameters affecting the growth thickness of the oxide layer.

SUMMARY

Embodiments may accurately predict a parameter affecting a growth thickness of an oxide layer of a silicon wafer, and may determine the thickness of the oxide layer when fabricating the silicon wafer.

An embodiment provides a method of predicting a thickness of an oxide layer of a silicon wafer including: aging a heat treatment furnace (furnace); measuring a thickness of each of the oxide layers after disposing a plurality of reference wafers in slots of a heat treatment boat in the furnace and forming oxide layers; and measuring a thickness of each of the oxide layers after disposing the plurality of reference wafers and test wafers in the slots of the heat treatment boat in the furnace and forming oxide layers.

Another embodiment provides a method of predicting a thickness of an oxide layer of a silicon wafer including: aging a heat treatment furnace (furnace); and measuring a thickness of each of the oxide layers after disposing a plurality of reference wafers and test wafers in slots of a heat treatment boat in the furnace and forming oxide layers.

The test wafers may include a first group and a second group that are different from each other in pretreatment before the forming of the oxide layer.

The test wafers of the first group and the second group may have different haze numbers or surface roughness.

In the step of aging the furnace, dummy wafers may be disposed in upper and lower slots among the slots of the heat treatment boat in the furnace.

The plurality of reference wafers and the test wafers may be disposed alternately in the slots of the heat treatment boat in the furnace to form the oxide layers.

The step of disposing the plurality of reference wafers and the test wafers in the slots of the heat treatment boat in the furnace and forming the oxide layers may be performed at least twice.

The plurality of test wafers may be fabricated with different cleaning conditions.

The plurality of test wafers may be dipped in a cleaning solution and cleaned.

The surface roughness of the test wafer may be 0.2 Å or less.

The thickness measurement of the oxide layer may be performed at at least five points of the wafer within two hours after the forming of the oxide layer.

DETAILED DESCRIPTION OF THE EMBODIMENTS

Hereinafter, embodiments are provided in order to explain the invention in detail, and will be described in detail with reference to accompanying drawings to help understanding of the invention.

However, embodiments according to the present invention may be modified into various other forms, and the scope of the present invention should not be construed as being limited to the embodiments set forth herein. Embodiments of the present invention are provided to more fully explain the present invention to those skilled in the art.

In addition, relational terms such as "first" and "second," "upper" and "lower," and the like, without necessarily requiring or implying any physical or logical relationship or order between its entities or elements, may only be used to distinguish one entity or element from another entity or element.

In order to fabricate an epitaxial wafer according to an embodiment, first, a silicon single crystal substrate is fabricated. Specifically, a silicon single crystal substrate is fabricated by a single crystal growth process for fabricating an ingot by the Czochralski method, a slicing process for obtaining a thin disk-shaped wafer by slicing a single crystal ingot, a grinding process for machining an outer circumferential portion of a wafer to prevent cracking and distortion of the wafer obtained by the slicing process, a lapping process for removing damages due to mechanical processing remaining on the wafer, a polishing process for mirror-polishing the wafer, and a cleaning process for removing abrasive or foreign substances adhering to the polished wafer. In particular, in a silicon single crystal substrate, a P-type dopant, for example, boron (B) may be doped at a high concentration in an ingot growth process. In addition, it is possible to determine an influence of a factor affecting a thickness of an oxide layer by forming an oxide layer of a silicon wafer while changing several factors and measuring a thickness thereof.

Figure 1:
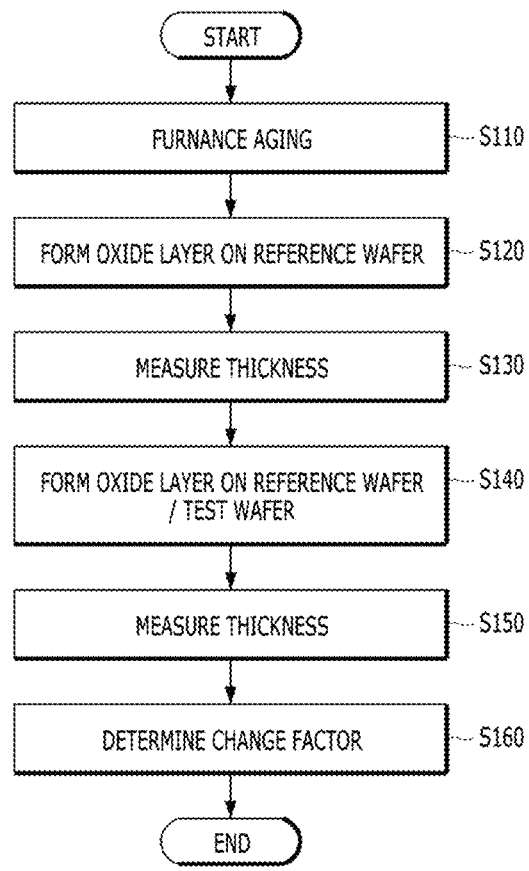
FIG. 1 is a flowchart of a method of predicting a thickness of an oxide layer of a silicon wafer according to an embodiment.

FIG. 1 is a flowchart of a method of predicting a thickness of an oxide layer of a silicon wafer according to an embodiment.

First, impurities in a heat treatment furnace (furnace) may be removed by aging the furnace, for example, by supplying and aging oxygen gas (S110).

Then, an oxide layer is grown on a reference wafer (S120). At this time, the reference wafer may be the silicon wafer fabricated by the above-described process, and the oxide layer may be grown by disposing a plurality of reference wafers in slots of a heat treatment boat in the furnace and by supplying oxygen gas at a certain temperature, for example, 800° C.

Then, thicknesses of the oxide layers grown on a surface of each of the reference wafers may be measured (S130). At this step and at a step to be described later, the thickness of the oxide layer grown on the surface of the wafer may be measured at a plurality of points, for example, at five points.

In addition, the thickness of the oxide layer may be measured within 2 hours in order to prevent an influence of other factors after growing the oxide layer, for example, a growth of a natural oxide layer.

Then, the above-described plurality of reference wafers and test wafers may be disposed in the slots of the heat treatment boat in the furnace, and the oxide layers may be formed (S140).

At this time, conditions for growing the oxide layer may be the same as in step S120 described above, and the reference wafers may be the same as the reference wafers before growing the oxide layer in the step S120 described above.

Steps S120 and S140 may be referred to as a pre run and a test run, respectively.

Then, the thicknesses of the oxide layers grown on the surface of each of the reference wafers and the test wafers may be measured (S150).

At this time, the test wafers may be one obtained by processing the reference wafers, and processing factors may be different.

Therefore, by measuring the thickness of the oxide layer of the reference wafers and the test wafers, it is possible to determine the change factors affecting the growth thickness of the oxide layer (S160).

Figure 2A:
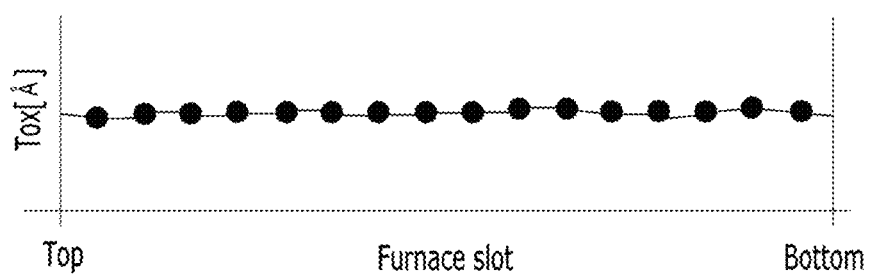
FIGS. 2A and 2B show thicknesses of oxide layers of a reference wafer and a test wafer, respectively.
Figure 2B:
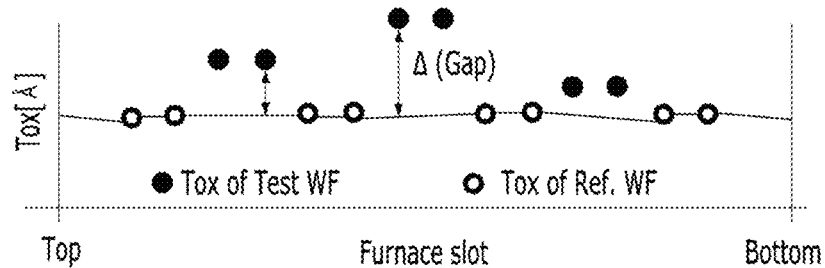

According to another embodiment, the pre run (S120) and thickness measurement (S130) of the above-described processes may be omitted. At this time, it is possible to determine the factor affecting the growth of the oxide layer through the thickness measurement (S150) after the test run (S140). FIGS. 2A and 2B show the thicknesses of the oxide layers of the reference wafer and the test wafer, respectively.

FIG. 2A shows a thickness of oxide layer (Tox) after a pre run process for reference wafers, and the thickness of the oxide layer grown on the reference wafers may be almost constant regardless of a position of a slot in the heat treatment boat.

FIG. 2B shows a thickness of an oxide layer after a test run process for reference wafers and test wafers.

In case of the reference wafers indicated in blue, the thickness of the oxide layer grown on the reference wafers may be almost constant regardless of a position of a slot in the heat treatment boat, and the test wafers indicated in red may have a relatively large variation in the thickness of the oxide layer depending on the position of the slot in the heat treatment boat.

At this time, in the test run, oxygen gas was supplied to the reference wafers, for example, at 800° C. for about 18 minutes and 50 seconds, and the thickness of the oxide layer may be an average of 34 Å. In addition, in the test run, oxygen gas was supplied to the test wafers, for example, at 900° C. for about 30 minutes, and the thickness of the oxide layer may be an average of 100 Å.

Figure 3:
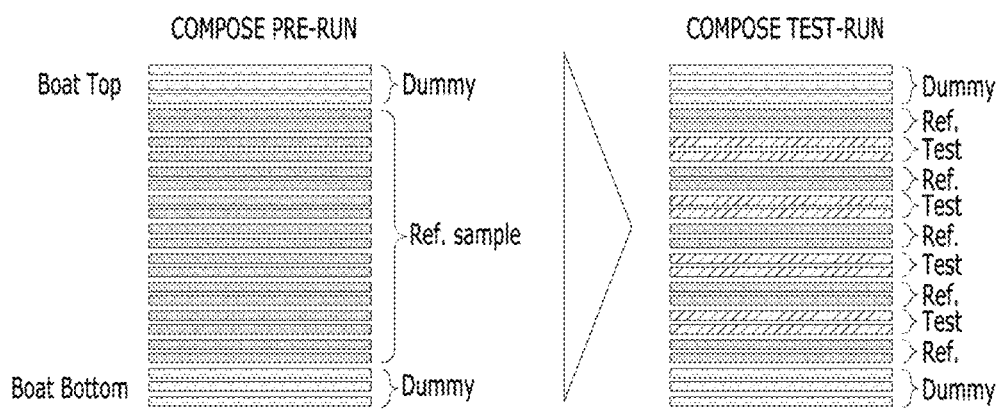
FIG. 3 shows the disposition of wafers in a heat treatment boat in a pre run and a test run.

FIG. 3 shows the disposition of wafers in a heat treatment boat in a pre run and a test run.

In the step of a pre run, dummy wafers may be disposed in a part of upper and lower slots in the heat treatment boat, and a reference wafer (Ref. Sample) may be disposed between the dummy wafers.

By disposing the dummy wafer, it is possible to prevent various kinds of gas flow and various kinds of contamination occurring in the heat treatment furnace.

In particular, a state of the dummy wafer may be stably maintained by disposing the dummy wafer on the upper and lower portions and aging, and the growth condition of the oxide layer in the heat treatment furnace may be maintained constantly.

In the step of a test run, dummy wafers may be disposed in a part of the upper and lower slots in the heat treatment boat, and reference wafers (Ref.) and test wafers (Test.) may be disposed alternately between the dummy wafers. At this time, the reference wafers and the test wafers may be disposed alternately in plural instead of one at a time.

Figure 4:
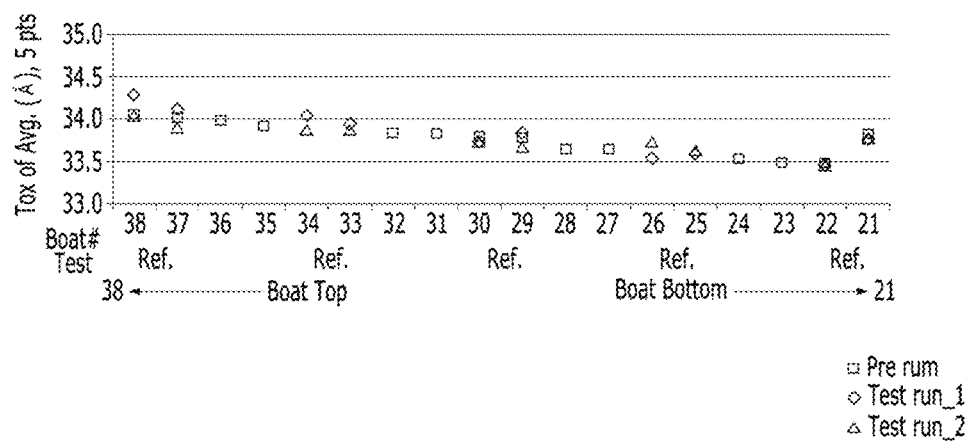
FIG. 4 shows a thickness of an oxide layer of a wafer according to slots in a heat treatment boat.

FIG. 4 shows a thickness of an oxide layer of a wafer according to slots in a heat treatment boat.

It may be determined that the thickness of the oxide layer grown on the surface of the wafer in pre run and two test runs in FIG. 4 is not related to the position of the slot in the heat treatment boat, and all the wafers used here may be the reference wafers.

Hereinafter, the factors affecting the growth of the oxide layer of the silicon wafer are to be determined by using a first group and a second group of silicon wafers which are different from each other in the pretreatment before forming or growing the oxide layer as the test wafer.

Figure 5A:
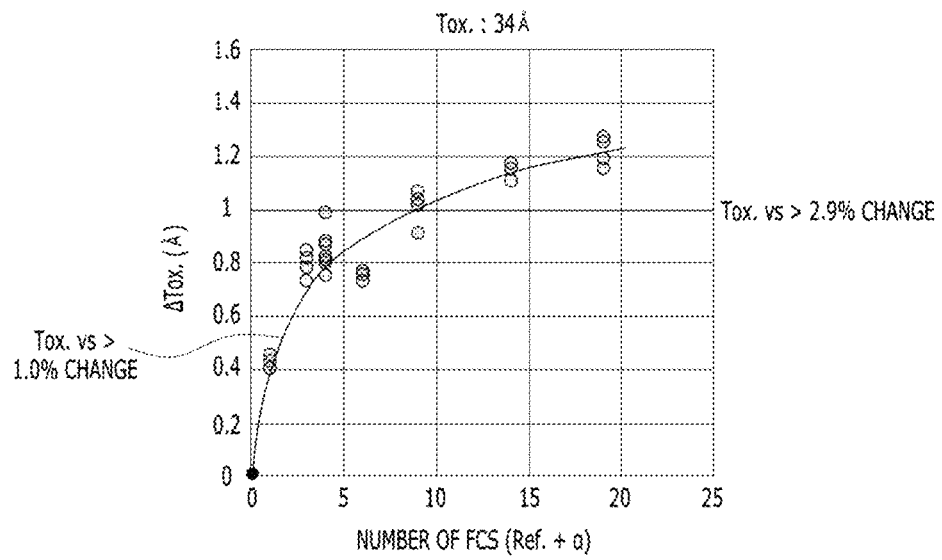
FIGS. 5A and 5B show changes in a thickness of an oxide layer according to changes in a surface structure of a wafer.
Figure 5B:
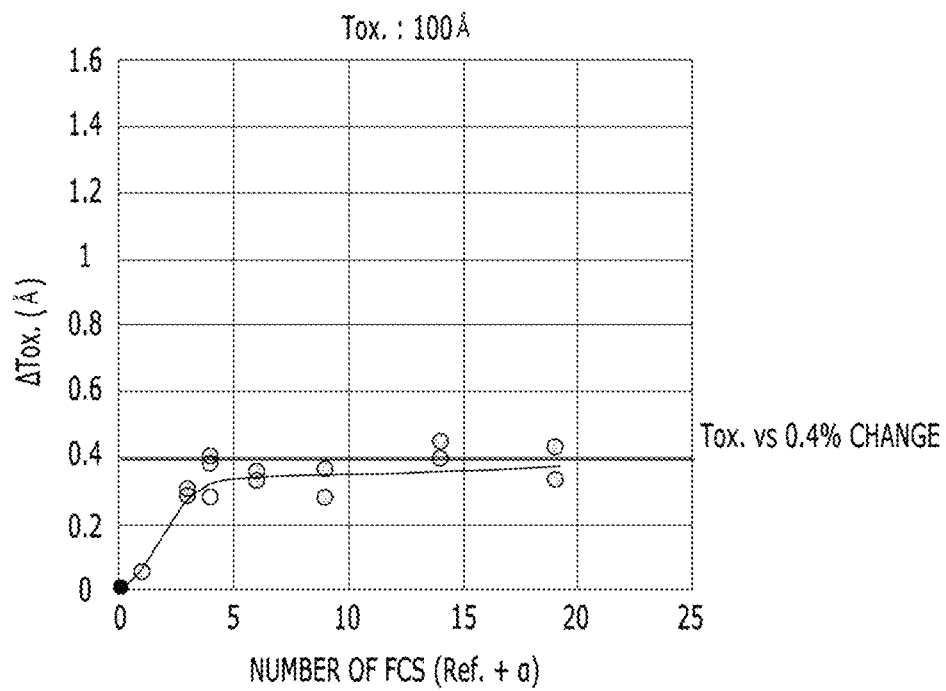

FIGS. 5A and 5B show changes in a thickness of an oxide layer according to changes in a surface structure of a wafer.

Cleaning conditions are different in order to change the surface structure of the wafer, specifically, a dipping time using an SC-1 is different, and FIG. 5A uses a wafer with a thickness of an oxide layer of 34 Å, and FIG. 5B uses a wafer with thickness of an oxide layer of 100 Å, where the thickness may be an average thickness.

In FIG. 5A, a thickness deviation of the oxide layer increases as the dipping time by SC-1 increases. However, in FIG. 5B, it may be seen that the thickness of the oxide layer hardly changes even though the dipping time by SC-1 increases.

It may be seen from FIGS. 5A and 5B that as the thickness of the oxide layer of the silicon wafer increases, even though the cleaning time increases, the degree of change of the thickness of the silicon oxide layer by the cleaning solution decreases.

At this time, the reason why the thickness deviation becomes small may be presumed to be due to the number of surface hazes of the wafer or to be due to roughness.

Figure 6A:
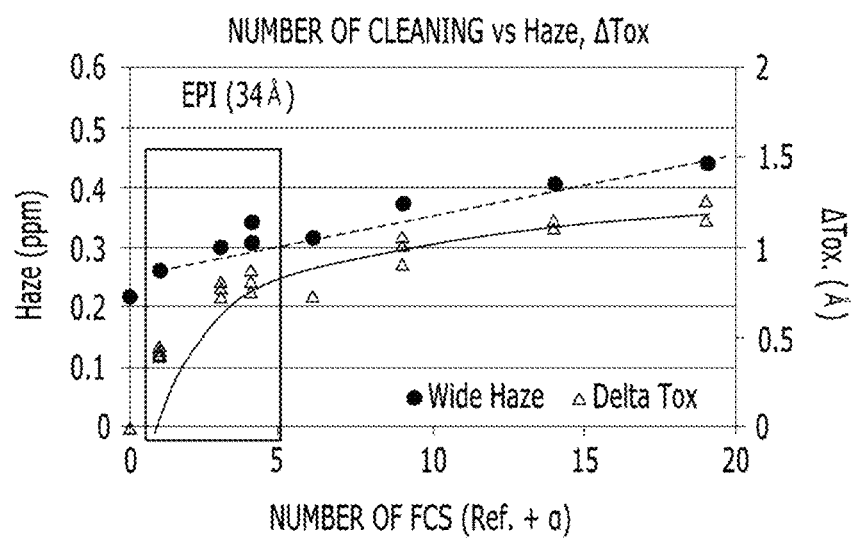
FIGS. 6A and 6B show a surface haze and roughness of a wafer according to an SC-1 dipping time, respectively.
Figure 6B:
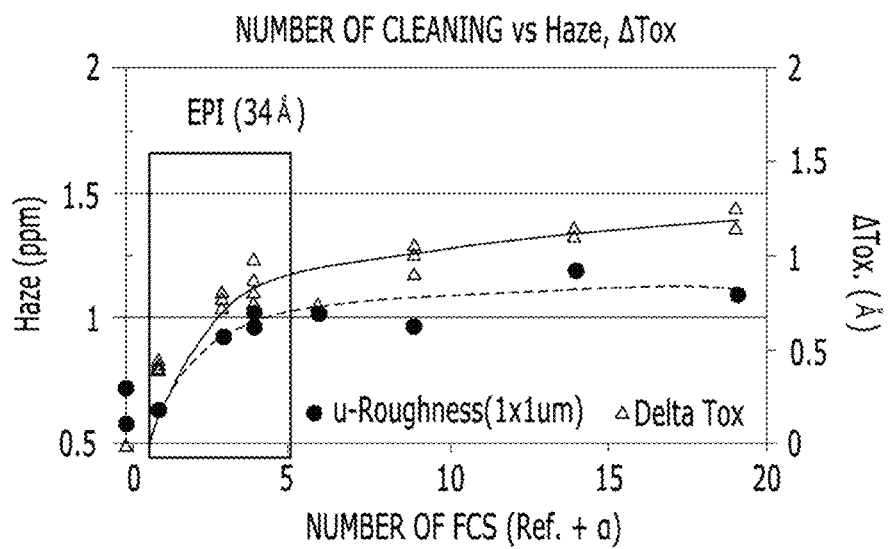

FIGS. 6A and 6B show a change of surface haze and roughness according to an SC-1 dipping time, respectively.

FIG. 6A shows the change of surface haze according to an SC-1 dipping time, and FIG. 6B shows surface roughness according to an SC-1 dipping time.

As shown in the drawings, the change of the thickness of the oxide layer is more sensitive to the change of the roughness than the haze of the silicon surface. Here, it may be interpreted that a surface area related to oxidation increases while the surface of the silicon wafer is roughened.

Figure 7A:
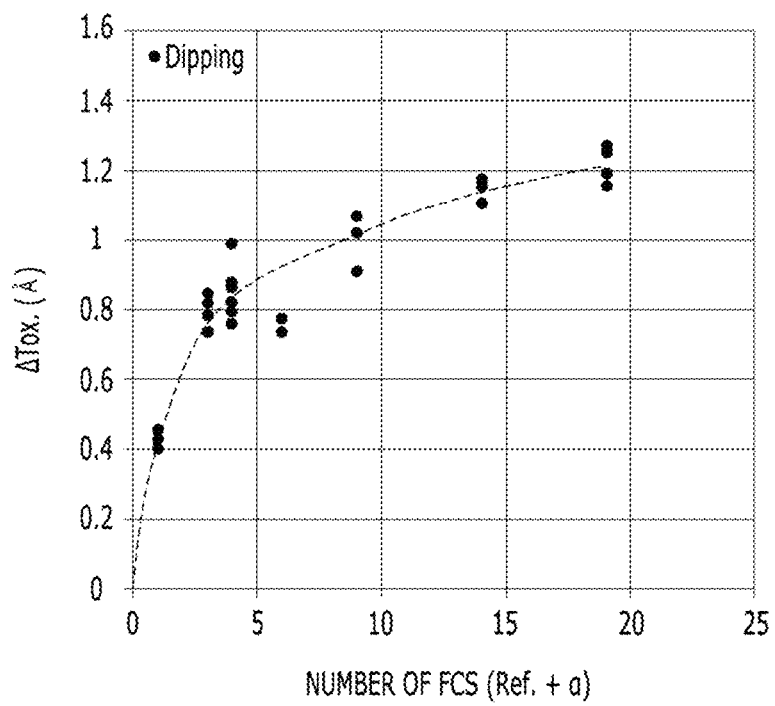
FIGS. 7A and 7B show changes in a thickness of an oxide layer of a wafer according to dipping and repeated cleaning of an SC-1, respectively, when an average thickness of an oxide layer is 34 Å.
Figure 7B:
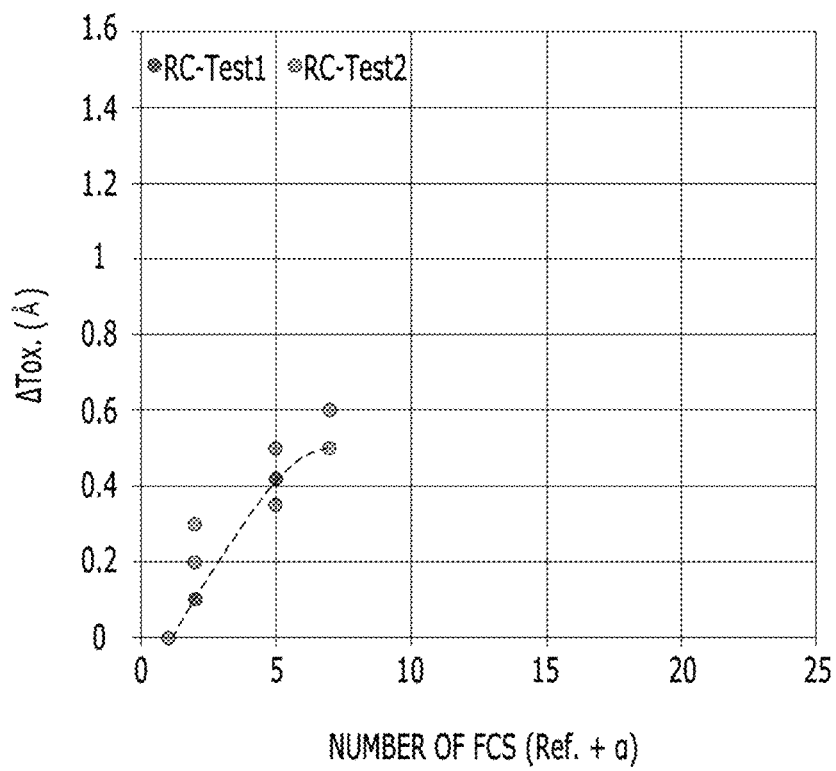
Figure 8A:
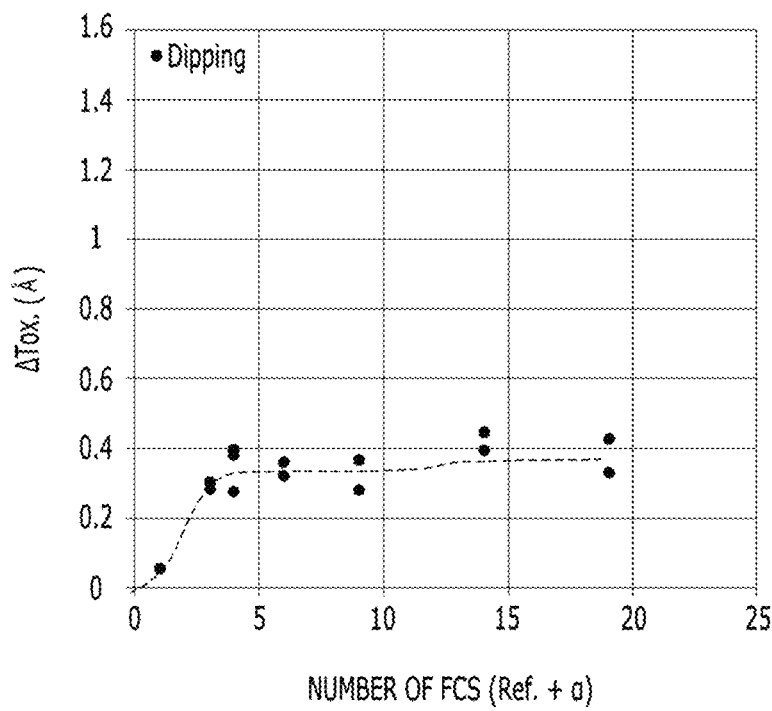
FIGS. 8A and 8B show changes in a thickness of an oxide layer of a wafer according to dipping and repeated cleaning of an SC-1, respectively, when an average thickness of an oxide layer is 100 Å.
Figure 8B:
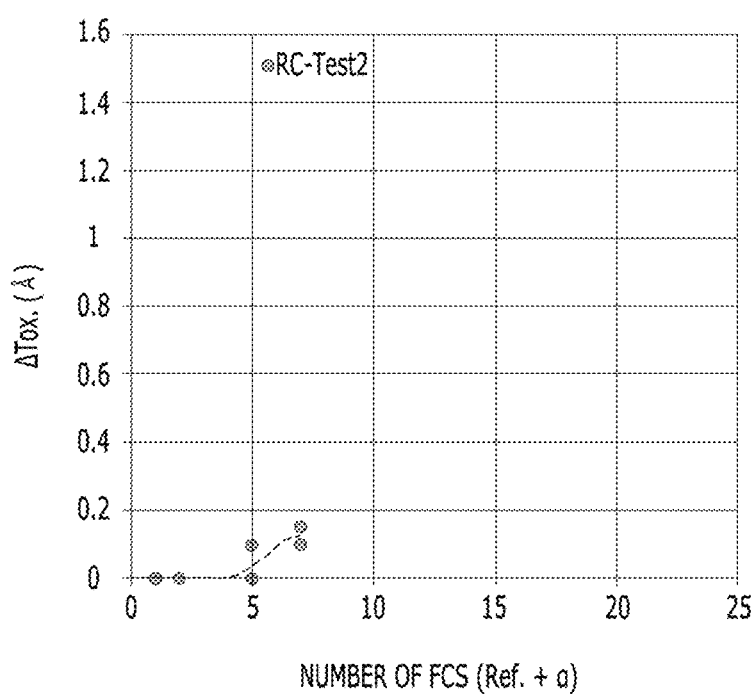

FIGS. 7A and 7B show changes in a thickness of an oxide layer of a wafer according to dipping and repeated cleaning of an SC-1, respectively, when an average thickness of an oxide layer is 34 Å, and FIGS. 8A and 8B show changes in a thickness of an oxide layer of a wafer according to dipping and repeated cleaning of an SC-1, respectively, when an average thickness of an oxide layer is 100 Å.

It may be seen from FIGS. 7A to 8B that the thickness deviation of the oxide layer after cleaning is smaller as the average thickness of the oxide layer is larger, and the thickness deviation of the oxide layer after cleaning in accordance with a repeated cleaning method is smaller than that of a method of continuously dipping into the cleaning solution.

From this, it is possible to understand a difference that etching of the oxide layer on the surface of the wafer continues in the dipping method, whereas etching is newly performed at every cleaning in the repeated cleaning method.

Figure 9A:
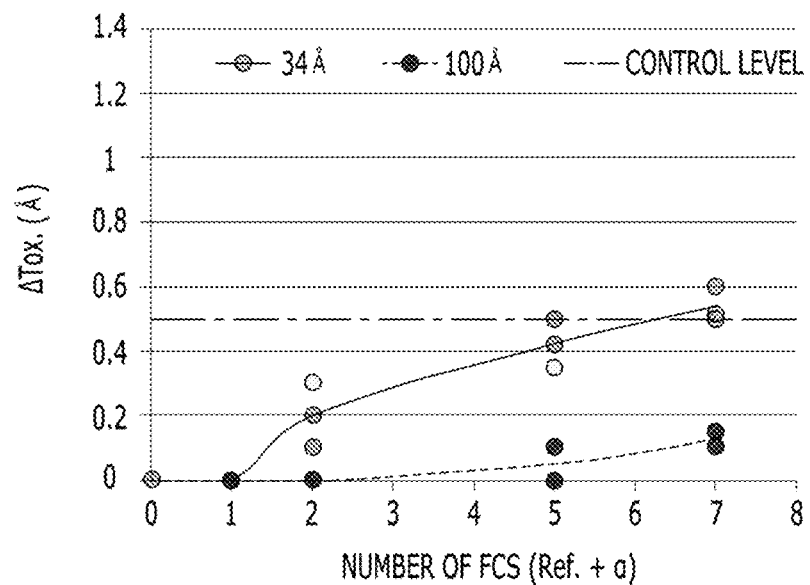
FIGS. 9A and 9B show a thickness deviation of an oxide layer of a wafer according change in a number of cleanings and a change in surface roughness, respectively.
Figure 9B:
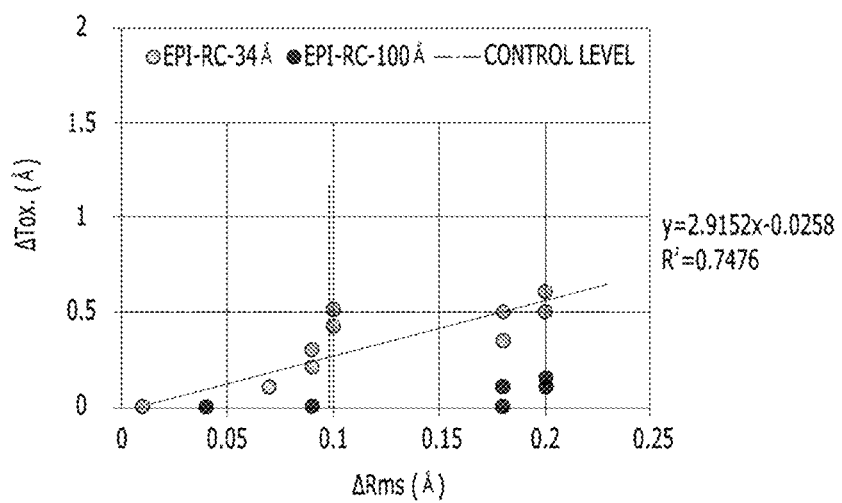

FIGS. 9A and 9B show a thickness deviation of an oxide layer of a wafer according to a change in a number of cleanings and a change in surface roughness, respectively.

It is necessary to control the thickness deviation of the oxide layer on the surface of the silicon wafer to be 0.5 Å or less. It may be seen from FIG. 9A that the thickness deviation is maintained even after cleaning in the case of a wafer having a thickness of 100 Å before cleaning, but the thickness deviation may exceed 0.5 Å as the number of cleanings increases in the case of a wafer having a thickness of 34 Å before cleaning.

It is necessary to control the thickness deviation of the oxide layer on the surface of the silicon wafer to be 0.5 Å or less. It may be seen from FIG. 9B that the thickness deviation may be maintained even after cleaning in the case of a wafer having a thickness of 100 Å before cleaning.

From this, it may be seen that in the case of the wafer having a thickness of 34 Å before cleaning, the thickness deviation may exceed 0.5 Å as the number of cleanings increases.

In addition, it may be seen from FIG. 9B that when the surface roughness of the silicon wafer is controlled to be 0.2 Å or less, the thickness of the subsequently grown oxide layer may be controlled to be 0.5 Å or less.

In a method of predicting a thickness of an oxide layer of a silicon wafer according to an embodiment, it is possible to measure a thickness thereof after disposing a plurality of reference wafers and test wafers in slots of a heat treatment boat in a furnace and forming oxide layers.

In addition, it may be determined that surface roughness is a factor that has a decisive influence on a growth of an oxide layer by using a first group and a second group, which are different from each other in pretreatment as the test wafers.

As described above, the embodiments have been described by limited embodiments and drawings, but the present invention is not limited to the embodiments, and various modifications and changes may be made therefrom by those skilled in the art to which the present invention belongs.

Therefore, the scope of the present invention should not be limited to the described embodiments, but should be defined by equivalents to the scope of the claims as well as the claims which will be described later.

What is claimed is:

1. A method of predicting a thickness of an oxide layer of a silicon wafer, the method comprising:
    aging a heat treatment furnace;
    measuring a thickness of each of a plurality of oxide layers after disposing a plurality of reference wafers in slots of a heat treatment boat in the furnace and forming the oxide layers; and
    measuring a thickness of each of the oxide layers after disposing the plurality of reference wafers and a plurality of test wafers in the slots of the heat treatment boat in the furnace and forming the oxide layers,
    wherein the plurality of test wafers include a first group and a second group that are different from each other in pretreatment before the forming of the oxide layers.

2. The method of claim 1, wherein the test wafers of the first group and the second group have different haze numbers or surface roughness.

3. The method of claim 1, wherein the aging of the furnace includes providing dummy wafers in upper and lower slots among the slots of the heat treatment boat in the furnace.

4. The method of claim 1, wherein different ones of the plurality of reference wafers are alternately disposed with different ones of the plurality of the test wafers in the slots of the heat treatment boat in the furnace to form the oxide layers.

5. The method of claim 1, wherein the disposing of the plurality of reference wafers and the plurality of test wafers in the slots of the heat treatment boat in the furnace and the forming the oxide layers is performed at least twice.

6. The method of claim 1, wherein the plurality of test wafers are fabricated with different cleaning conditions.

7. The method of claim 1, wherein the plurality of test wafers are dipped in a cleaning solution and cleaned.

8. The method of claim 1, wherein surface roughness of each of the test wafers is 0.2 Å or less.

9. The method of claim 1, wherein the measuring of the thickness of the oxide layer is performed at five different points of the wafer within two hours after the forming of the oxide layers.

10. A method of predicting a thickness of an oxide layer of a silicon wafer, the method comprising:
    aging a heat treatment furnace; and
    measuring a thickness of each of a plurality of oxide layers after disposing a plurality of reference wafers and a plurality of test wafers in slots of a heat treatment boat in the furnace and forming the oxide layer, wherein the plurality of test wafers are fabricated with different cleaning conditions, and the plurality of test wafers are dipped in a cleaning solution and cleaned.

11. The method of claim 10, wherein the plurality of test wafers include a first group and a second group that are different from each other in pretreatment before the forming of the oxide layers, and the test wafers of the first group and the second group have different haze numbers or surface roughness.

12. The method of claim 10, wherein the aging of the furnace includes providing dummy wafers in upper and lower slots among the slots of the heat treatment boat in the furnace.

13. The method of claim 10, wherein different ones of the plurality of reference wafers are alternately disposed with different ones of the plurality of test wafers in the slots of the heat treatment boat in the furnace to form the oxide layers.

14. The method of claim 10, wherein surface roughness of each of the test wafers is 0.2 Å or less, and the measuring of the thickness of the oxide layer is performed at five different points of the wafer within two hours after the forming of the oxide layers.

15. A method of predicting a thickness of an oxide layer of a silicon wafer, the method comprising:

aging a heat treatment furnace;

measuring a thickness of each of a plurality of oxide layers after disposing a plurality of reference wafers in slots of a heat treatment boat in the furnace and forming the oxide layers; and measuring a thickness of each of the oxide layers after disposing the plurality of reference wafers and a plurality of test wafers in the slots of the heat treatment boat in the furnace and forming the oxide layers, wherein the disposing of the plurality of reference wafers and the plurality of test wafers in the slots of the heat treatment boat in the furnace and the forming of the oxide layers is performed at least twice.

16. The method of claim 15, wherein the plurality of test wafers include a first group and a second group, wherein the test wafers of the first group and the second group have different haze numbers or surface roughness.

17. The method of claim 15, wherein the aging of the furnace includes providing dummy wafers in upper and lower slots among the slots of the heat treatment boat in the furnace.

18. The method of claim 15, wherein different ones of the plurality of reference wafers are alternately disposed with different ones of the plurality of the test wafers in the slots of the heat treatment boat in the furnace to form the oxide layers.

* * * * *